(12) United States Patent
Ebert

(10) Patent No.: US 6,269,004 B1
(45) Date of Patent: Jul. 31, 2001

(54) ELECTRIC SUBASSEMBLY

(75) Inventor: Wolfgang Ebert, Trostberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/319,611

(22) PCT Filed: Feb. 11, 1998

(86) PCT No.: PCT/EP98/00763

§ 371 Date: Jun. 8, 1999

§ 102(e) Date: Jun. 8, 1999

(87) PCT Pub. No.: WO98/40935

PCT Pub. Date: Sep. 17, 1998

(30) Foreign Application Priority Data

Mar. 13, 1997 (EP) .................................................. 97104302

(51) Int. Cl.[7] ................................ H05K 7/14; H05K 9/00
(52) U.S. Cl. ........................ 361/736; 361/752; 361/753; 361/799; 439/95; 439/101; 439/108; 174/51
(58) Field of Search ..................................... 361/752–753, 361/799, 800, 816, 818, 794; 439/95, 92, 101, 108, 98, 947, 387, 389, 391, 395, 393, 398, 400, 402; 174/51

(56) References Cited

U.S. PATENT DOCUMENTS 4,521,828   6/1985  Fanning .
4,617,708  10/1986  Fanning .

FOREIGN PATENT DOCUMENTS 37 38 545 A1   11/1987  (DE) .
1 463 751       3/1974  (GB) .
07254789A  *  10/1995  (JP) ............................................ 4/64

* cited by examiner

Primary Examiner—Jayprakash N. Gandhi
Assistant Examiner—Thanh Y. Tran
(74) Attorney, Agent, or Firm—Schiff Hardin & Waite

(57) ABSTRACT

An electric module which includes a printed circuit board and at least one electrical subassembly arranged thereon is disposed within a metallic housing and is grounded to the metallic housing by way of a wire bridge which extends transversely across a cutout disposed in the printed circuit board. The metallic housing is integrally connected to a contact tongue which extends through the cutout and the printed circuit board before engaging the wire bridge. The wire bridge connects one side of the printed circuit board to a ground conductor track disposed on the opposing side of the printed circuit board. Preferably, the contact tongue includes two closely spaced contact elements that are spaced apart for frictionally receiving the wire bridge therebetween. Further, the cutout extends transversely across the contact bridge at an angle so the flat plug-like contact element also extends across the wire bridge transversely at an angle for improved frictional engagement between the wire bridge and the two contact elements. Preferably, the contact elements cut into or mar the wire bridge upon insertion.

20 Claims, 1 Drawing Sheet

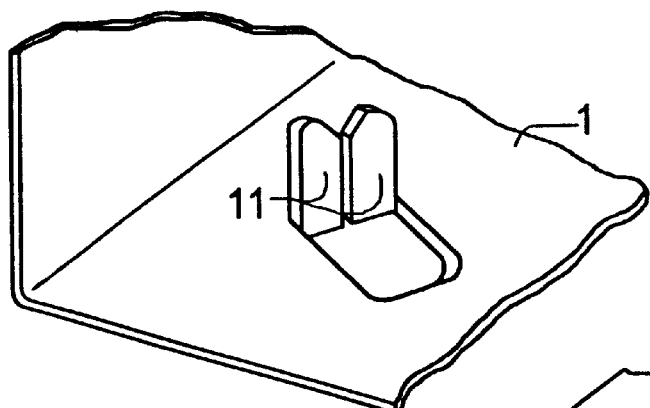
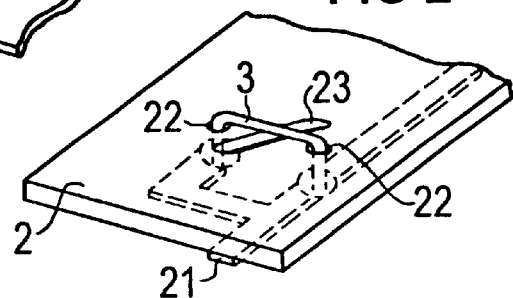
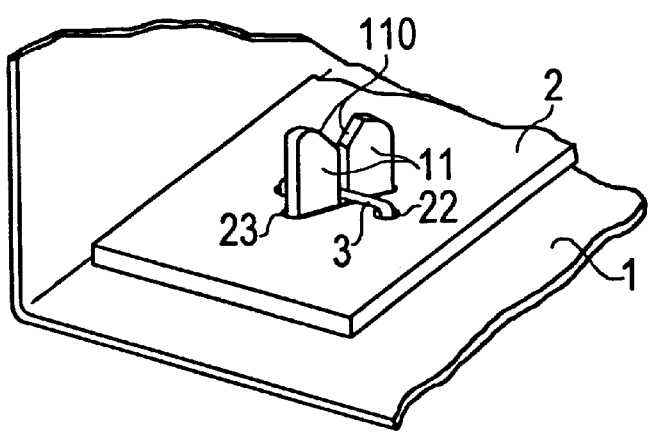
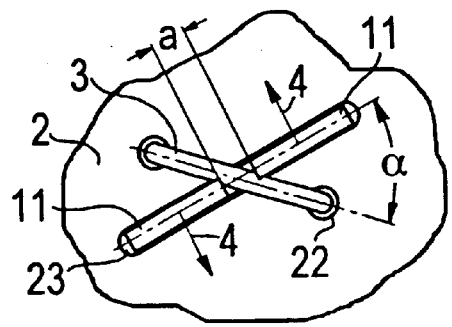

ELECTRIC SUBASSEMBLY

FIELD OF THE INVENTION

The present invention relates generally to an electric module that includes a printed circuit board with electrical assemblies attached thereto and which is disposed in a metallic housing. More specifically, the present invention relates to an effective means for grounding the circuit board and electrical assemblies to the metallic housing.

BACKGROUND OF THE INVENTION

Parts of electric appliances, systems or devices which are operationally live must in principle be insulated or covered in such a way that they cannot be touched. In the event of a fault, however, conductive parts could nevertheless assume a voltage with respect to ground. Consequently, a range of protective measures are generally prescribed—depending on the field of application—in order nevertheless to eliminate risk. These include, inter alia, total insulation, protective grounding and/or neutralization. In the case of protective grounding, conductive system parts are connected via a protective conductor to a ground electrode, in the latter case to the neutral conductor of the network. Apart from such protective grounding, in many instances there is also a need for ground connections in the case of electric circuits, in order to fulfill a specific function in a defined way. For example, it is possible using such functional ground to discharge radio-frequency signal components, that is to say to eliminate RF interference.

A precondition for the proper functioning of the said measures is that such conductive appliances or system parts are connected in an electrically reliable fashion via a protective conductor to the ground electrode and/or the neutral conductor. In the case of an electric module having a pluggable printed board assembly which comprises a printed circuit board and electric subassemblies arranged thereon and is arranged in a metallic housing, one of the possibilities known for this purpose consists in connecting the ground conductor at one end to a ground conductor track of the printed circuit board in a mechanically reliable fashion. An eye is integrally formed on the end of the ground conductor to be connected to the housing, said eye possibly also being crimped on as a discrete element, and said eye is fastened to the housing part to be protected by means of a screwed connection protected against inadvertent loosening. This configuration, very reliable per se, of a ground conductor contact has the disadvantage that it is relatively expensive, in particular in the case of mass production of electric modules, and is difficult to handle. Either this screwed connection has to be performed manually, or expensive component mounting machines are required for this purpose.

A ground conductor contact which is configured as a plug-in connection is easier to handle. Since a multiplicity of solutions are known for this purpose, reference may be made in this connection to GB-B 14 63 751 merely by way of example. Although this embodiment is no less complicated in terms of production engineering, it is used nevertheless in the case of a multiplicity of applications, in particular because of the possibility of being handled without tools during maintenance work. In principle, on the housing side this plug-in connection comprises a contact element with a flat contact tongue and a cable shoe, which can be pushed over the latter and is connected in an electrically effectively conducting fashion, for example via a crimp contact, to the end of the ground conductor which is to be connected. This contact tongue is normally constructed as part of a metallic angle which, by means of a connection which has an electrically conductive configuration, is fixed to the part to be earthed of the electric module. Because of its functional reliability, this solution is used despite the expense of production in a multiplicity of applications, in particular also because it has the property of being able to be released again easily.

The foregoing comments demonstrate that a certain expense is incurred in the case of detachable ground contacts for reasons of electrical safety. In order to produce the screwed connection with the housing part to be grounded, a bore for accepting a self-tapping fastening screw is frequently forced into said housing part in order to save a dedicated nut. However, the outlay on manufacture and mounting remains high. If this outlay could be reduced even to an only noteworthy extent, this would already mean a substantial saving in costs in the case of a mass production product.

Therefore there is a need to create in the case of an electric module of the type mentioned at the beginning a further embodiment for the ground contact which can be realized in a simpler and thus more cost effective way in mass production without loss of electric safety.

SUMMARY OF THE INVENTION

The present invention satisfies the aforenoted need by providing an electric module which comprises a printed circuit board assembly comprising a printed circuit board with electrical assemblies attached thereto and which is housed in a metallic housing. The circuit board further comprises a ground conductor track electrically connected to a wire bridge. The circuit board also includes cutout that extends transversely to the wire bridge and which extends through the circuit board. The metallic housing is conductively connected to a contact tongue which extends through the circuit board and which engages the wire bridge.

In an embodiment, the circuit board comprises a component side and an underside. The wire bridge is disposed on the component side and the circuit board is disposed on the underside.

In an embodiment, the circuit board comprises two bores aligned with the ground conductor track. The wire bridge comprises two opposing ends each of which are soldered to one of the bores for making electrical contact with the ground conductor track.

In an embodiment, the contact tongue is integrally connected to the metallic housing.

In an embodiment, the contact tongue is frictionally received in the cutout.

In an embodiment, the contact tongue comprises a pair of contact element spaced apart by a predetermined spacing. The wire bridge comprises a wire having a diameter. The spacing between the contact elements is about equal to that of the diameter of the wire so that the contact elements extend through the cutout and past the wire bridge and so that the wire bridge is frictionally accommodated between the contact elements.

In an embodiment, the cutout extends transversely across the wire bridge at an angle so that despite the fact that the spacing between the contact elements is about the same as the diameter of the wire, the wire is frictionally accommodated between the contact elements.

In an embodiment, the contact elements may mar the wire.

In an embodiment, the angle is less than 90 degrees.

In an embodiment, the angle ranges from about 30 degrees to about 60 degrees.

In an embodiment, the contact elements comprise flat plugs arranged in a side-by-side fashion with narrower sides of the flat plugs facing each other. Further, the flat plugs each comprise a distal end which is tapered or slanted to form a V-shaped gap for receiving and guiding the wire bridge between the flat plugs or contact elements.

This way of achieving the object according to the present invention is based on the critical consideration that in producing a pluggable printed board assembly a specific production technology is used for fitting the printed circuit board with components and for their electric connection, whereas the production of the ground contact itself requires further mounting steps in the case of conventional realization, which differ therefrom technologically and are therefore cost intensive.

This technological discontinuity in the production process is avoided by the solution according to the invention. Part of the ground conductor is a wire bridge which is connected in a mechanically reliable fashion to the printed circuit board of the pluggable printed board assembly. In the mounting of the printed circuit board, said wire bridge is only one of a plurality of components which require the same mounting steps. In this case, the wire bridge is preferably inserted into two bores in the printed circuit board and soldered in contact with ground conductor of the printed circuit board like the remaining electric subassemblies of the pluggable printed board assembly. This wire bridge is assigned a cutout, aligned transverse to its longitudinal direction, in the printed circuit board, preferably in the form of a slot-shaped opening. When the printed circuit board is placed on the housing of the electric module, there is inserted into said cutout a contact tongue which projects from the housing in the direction of the printed circuit board and which in the mounted state engages through the cutout and, being in mechanical contact with the wire bridge, connects the latter in an electrically conducting fashion to the housing of the module.

In accordance with a development of the invention, this contact tongue is constructed in such a way that it is integrally connected to the housing as a shaped part cut out from the housing material, the assigned cutout in the printed circuit board then having—referring to the narrow side—a width which is prescribed by the thickness of the housing material.

It is particularly advantageous when the contact tongue comprises a pair of contact elements which are arranged with their long sides aligned with one another, have between their narrow sides a predetermined spacing from one another that is adapted to the diameter of the wire bridge, and in the mounted state embrace the wire bridge from both sides in an erect and force-closed fashion with elastic prestressing. Given an appropriately close tolerance in the spacing of the two contact elements, the latter are then elastically braced relative to one another during the mounting operation by the forcing-in of the wire bridge, the spring excursion being very slight. Because of this slight spring excursion, the resilient properties of the housing material used are of merely subordinate importance. Consequently, the selection of material for the metallic housing and also for the contact elements is in no way limited by this function. On the other hand, as a consequence of this elastic prestressing of the two contact elements, the latter sink from both sides with their lateral edges into the surface of the wire bridge and thus ensure that the contact resistance between them and the wire bridge satisfies the values to be required for a ground contact. Other objects and advantages of the present invention will become apparent from reading the following detailed description and appended claims, and upon reference to the accompanying drawings.

BRIEF DESCRIPTION OF THE DRAWING

Further advantages and configurations of the solution according to the invention are to be gathered from the explanations relating to an exemplary embodiment of the invention which is described in more detail below with the aid of the drawing.

In the drawing:

FIG. 1 is a partial perspective view of a metallic housing with a pair of integrally connected contact elements made in accordance with the present invention;

FIG. 2 is a partial perspective view of a printed circuit board illustrating a wire bridge, ground conductor track and cutout made in accordance with the present invention;

FIG. 3 is a partial perspective view of the printed circuit board shown in FIG. 2 as installed on the metallic housing shown in FIG. 1; and FIG. 4 is a partial top plan view of the printed circuit board and metallic housing shown in FIG. 3.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

A metallic housing 1 for an electric module is represented in FIG. 1 only diagrammatically and in a detail, since it is a general practice to protect operationally live subassemblies of an electric module against being touched inadvertently. Consequently, a great variety of embodiments which are mostly formed from sheet metal by edge folding are also known for such housings. It is therefore unnecessary here to show and describe such an embodiment of a housing in all its details. What is essential here, above all, is a pair of tongue-shaped contact elements 11 which are firstly cut out from the base of the housing 1 by punching and then formed in a vertically projecting fashion therefrom by edge folding. These contact elements 11 form the connection on the housing side for a ground contact.

Likewise represented diagrammatically in FIG. 2 is a printed circuit board 2, whose component side points upwards. Printed circuit boards are likewise generally known as a supporting subassembly for electric or electronic pluggable printed board assemblies. In principle, electric subassemblies—not represented here—are inserted from above into such a printed circuit board 2 with their wire-shaped connecting contacts, being inserted into prepared through bores, and are mechanically connected from the underside by being soldered to conductor tracks, the result being the circuit arrangement with corresponding line connections which is adapted to the application. This principle of the construction of a pluggable printed board assembly with a printed circuit board 2 which supports the electric subassemblies of the respective circuit arrangement and can be constructed in one, but also a plurality of layers, is so generally known that there is probably no need here to explain further details.

Instead, only a diagrammatic indication is given of a grounding conductor track 21 arranged on the underside of the printed circuit board 2. This ground conductor track 21 is connected to a wire bridge 3 precisely in the way described for the connection of electric subassemblies. The wire bridge 3 is formed as a U-shaped bow from a segment of a conventional circuit wire, inserted from above into a pair of corresponding through bores 22 in the printed circuit board 2, and connected on the underside of the printed circuit board 2 via corresponding connecting areas to the earthing conductor track 21 at corresponding soldering points.

This wire bridge 3 is now assigned a cutout 23 in the form of a slot-shaped opening, transverse to the longitudinal axis of the wire bridge, through the printed circuit board 2. During the mounting operation, this cutout 23 accepts the tongue-shaped contact elements 11 of the housing 1 which have been described with the aid of FIG. 1.

The printed circuit board 2 is shown diagrammatically in FIG. 3 in the mounted state, that is to say inserted into the housing 1. This representation makes it clear that the two contact elements 11 are rounded off on the outsides of their end faces, in order to be able to insert them more easily into the cutout 23 in the printed circuit board 2. Furthermore, the mutually facing insides of these end faces of the contact elements 11 have bevelled run-on edges 110 so that, during the mounting operation, the wire bridge 3 slides in between the two contact elements 11 with appropriate guidance.

The mounted state represented in FIG. 3 is shown from above in FIG. 4 in a view of a detail. This view makes it clear that the connecting line of the through bores 22 for accepting the wire bridge 3 is at a prescribed angle α transverse to the longitudinal direction of the cutout 23 in the printed circuit board, which accepts the appropriately positioned contact elements 11 fixed on the housing side. The width of the narrow side of the cutout 23 is of a tolerance such that the tongue-shaped contact elements 11 can still be inserted conveniently with their thickness as given by the wall thickness of the housing material. The dimensioning of a mutual spacing "a" of said contact elements 11 is also of functional importance. The essential reference parameters for dimensioning said spacing a are, on the one hand, the diameter of the wire bridge 3 and, on the other hand, the said angle a, that is to say the alignment of the contact elements 11 with reference to the longitudinal axis of the wire bridge 3. In order to ensure high functional reliability of the ground contact, that is to say as low as possible a contact resistance between the contact elements 11 and the wire bridge, the spacing "a" is to be of closer tolerance than the projection of the diameter of the wire bridge 3 onto the longitudinal direction of the contact elements 11.

Under these preconditions, the contact elements 11, which are much stiffer in the direction of their long sides than in the direction of their narrow sides, are forced away from the wire bridge 3 essentially transverse to the longitudinal direction of the cutout 23 when the wire bridge 3 is mounted. This is indicated by arrows 4 in FIG. 4. The spring excursion of the contact elements 11 is limited by the prescribed width of the narrow side of the cutout 23, which guides the contact elements 11. It follows from this that, even in the case of a relatively soft material, they only brace one another elastically and—as FIG. 4 shows—sink with their cutting edges into the surface of the wire bridge 3 from both sides. The result is that an optimum contact surface between the contact elements 11 and the wire bridge 3, as well as a high contact force because of the elastic prestressing of the contact elements 11, are permanently prescribed. The transverse positioning of the longitudinal axes of the contact elements 11 and the wire bridge 3 relative to one another evidently makes a substantial contribution to functional reliability. It is therefore advantageous to select the angle α to be plainly smaller than 90°; this angle α should preferably be in a range from approximately 30° to 60°.

It is advantageous that in this embodiment of a ground contact for electric modules, the material properties both of the housing 1 of the module—and thus of the contact elements 11—and of the wire bridge 3 are of only subordinate importance for the functional reliability of the earthing contact. Furthermore, this ground contact can be realized simply and reliably with the aid of means, including tools and devices, which are conventional in the production and fitting of printed circuit boards. The outlay for this ground contact which exceeds the production of the actual electric circuit is low. It is optimized, in particular, when the contact elements on the housing side are cut out directly from a housing wall and therefore no use is made of a dedicated fastening angle screwed to the housing and supporting the contact elements. The described configuration of an earthing contact between a pluggable printed board assembly and the housing is a cost-reducing solution accompanied by high functional reliablility precisely in the case of high batch numbers for electric modules to be produced. From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. An electric module comprising:
   a printed circuit board assembly having a printed circuit board having a component side with electrical assemblies attached thereto, the circuit board and electrical assemblies being disposed within a metallic housing,
   the circuit board having an underside with a ground conductor track, two bores aligned with the ground conductor track, and a wire bridge having two opposing ends, the wire bridge being disposed on the component side with each opposing end of the wire bridge being soldered into one of the bores to form an electrical connection to the ground conductor track, the circuit board having a cutout that extends transversely to the wire bridge and which extends through the circuit board, and
   the metallic housing being conductively connected to a contact tongue which extends through the circuit board and which engages the wire bridge.

2. The electric module of claim 1, wherein the contact tongue is integrally connected to the metallic housing.

3. The electric module of claim 1, wherein the contact tongue is frictionally received in the cutout.

4. An electric module comprising:
   a printed circuit board assembly comprising a printed circuit board with electrical assemblies attached thereto, the circuit board and electrical assemblies being disposed within a metallic housing,
   the circuit board further comprising a ground conductor track electrically connected to a wire bridge, the circuit board further comprising a cutout that extends transversely to the wire bridge and which extends through the circuit board,
   the metallic housing being conductively connected to a contact tongue, the contact tongue having a pair of contact elements spaced apart by a spacing, the wire bridge comprising a wire having a diameter, the spacing between the contact elements being about equal to the diameter of the wire, the contact elements extending through the cutout and past the wire bridge so that the wire bridge is frictionally accommodated between the contact elements.

5. The electric module of claim 4, wherein the cutout extends transversely across the wire bridge at an angle, and the contact elements extend through the cutout and past the wire bridge at the angle so that the wire bridge is frictionally accommodated between the contact elements.

6. The electric module of claim 5, wherein the angle is less than 90 degrees.

7. The electric module of claim 5, wherein the angle ranges from about 30 degrees to about 60 degrees.

8. The electric module of claim 4, wherein the contact elements mar the wire.

9. The electric module of claim 4 wherein the contact elements comprise flat plugs each comprising a cross section with two wider sides and two narrower sides, the contact elements being arranged side-by-side with one narrower side of each contact element facing one narrower side of the other contact element, each contact element comprising a distal end, each distal end comprising slanted surface for guiding the wire bridge between the two contact elements, the slanted surfaces of the two contact elements forming a V-shaped gap for receiving the wire bridge.

10. An electric module comprising:

a printed circuit board assembly comprising a printed circuit board with electrical assemblies attached thereto, the circuit board and electrical assemblies being disposed within a metallic housing, the circuit board further comprising a ground conductor track disposed on one side of the circuit board, the ground conductor track being connected to a wire bridge disposed on an opposing side of the circuit board, the circuit board further comprising a cutout that extends transversely to the wire bridge and which extends through the circuit board, the metallic housing being conductively connected to a contact tongue which is frictionally received in the cutout as the tongue extends through the cutout in the circuit board before engaging the wire bridge.

11. The electric module of claim 10 wherein the circuit board comprises a component side and an underside, the wire bridge being disposed on the component side of the circuit board, the ground conductor track being disposed on the underside of the printed circuit board.

12. The electric module of claim 11 wherein the circuit board comprises two bores aligned with the ground conductor track, the wire bridge comprises two opposing ends, each opposing end of the wire bridge being soldered into one of the bores.

13. The electric module of claim 10 wherein the contact tongue comprises a pair of contact elements spaced apart by a spacing, the wire bridge comprising wire having a diameter, the spacing between the contact elements being about equal to the diameter of the wire, the contact elements extending though the cutout and past the wire bridge so that the wire bridge is frictionally accommodated between the contact elements.

14. The electric module of claim 13, wherein the contact elements mar the wire.

15. The electric module of claim 13 wherein the contact elements comprise flat plugs each comprising a cross section with two wider sides and two narrower sides, the contact elements being arranged side-by-side with one narrower side of each contact element facing one narrower side of the other contact element, each contact element comprising a distal end, each distal end comprising slanted surface for guiding the wire bridge between the two contact elements, the slanted surfaces of the two contact elements forming a V-shaped gap for receiving the wire bridge.

16. The electric module of claim 10 wherein the cutout extends transversely across the wire bridge at an angle, the contact tongue comprises a pair of contact elements spaced apart by a spacing, the wire bridge comprising wire having a diameter, the spacing between the contact elements being about equal to the diameter of the wire, the contact elements extending through the cutout and past the wire bridge at the angle so that the wire bridge is frictionally accommodated between the contact elements.

17. The electric module of claim 16, wherein the angle is less than 90 degrees.

18. The electric module of claim 16, wherein the angle ranges from about 30 degrees to about 60 degrees.

19. The electric module of claim 10 wherein the contact tongue is integrally connected to the metallic housing.

20. An electric module comprising:

a printed circuit board assembly comprising a printed circuit board with electrical assemblies attached thereto, the circuit board and electrical assemblies being disposed within a metallic housing, the circuit board comprising a component side and an underside, the circuit board further comprising a ground conductor track disposed the underside of the circuit board, the ground conductor track being connected to a wire bridge disposed the component side of the circuit board, the circuit board further comprising a cutout that extends transversely to the wire bridge at angle and which extends through the circuit board, the circuit board comprising two bores aligned with the conductor track, the wire bridge comprising two opposing ends, each opposing end of the wire bridge being soldered into one of the bores, the metallic housing being integrally connected to a contact tongue which extends through the cutout of the circuit board before engaging the wire bridge, the contact tongue being frictionally received in the cutout, the contact tongue comprising two spaced apart contact elements, the contact elements each comprise a flat plug having a cross section with two wider sides and two narrower sides, the contact elements being arranged side-by-side with one narrower side of each contact element facing one narrower side of the other contact element, each contact element comprising a distal end, each distal end comprising slanted surface for guiding the wire bridge between the two contact elements, the slanted surfaces of the two contact elements forming a V-shaped gap for receiving the wire bridge, the wider sides of the contact elements frictionally engaging the cutout, the wire bridge comprising wire having a diameter, the spacing between the contact elements being about equal to the diameter of the wire, the contact elements extending though the cutout and past the wire bridge at the angle so that the wire bridge is frictionally accommodated between the contact elements, the angle ranging from about 30 degrees to about 60 degrees.

* * * * *